(12) United States Patent
Cherif et al.

(10) Patent No.: US 11,231,742 B1
(45) Date of Patent: Jan. 25, 2022

(54) CLOCK DISTRIBUTION RESONATOR SYSTEM

(71) Applicants: Bouchaib Cherif, Yorktown Heights, NY (US); Max E. Nielsen, Caldwell, IL (US)

(72) Inventors: Bouchaib Cherif, Yorktown Heights, NY (US); Max E. Nielsen, Caldwell, IL (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/194,462

(22) Filed: Mar. 8, 2021

(51) Int. Cl.
*G06F 1/10* (2006.01)
*H03L 7/093* (2006.01)

(52) U.S. Cl.
CPC ............... *G06F 1/10* (2013.01); *H03L 7/093* (2013.01)

(58) Field of Classification Search
None
See application file for complete search history.

(56) References Cited

U.S. PATENT DOCUMENTS

| | | | |
|---|---|---|---|
| 3,619,504 A | 11/1971 | De Veer et al. | |
| 5,365,205 A | 11/1994 | Wong | |
| 5,432,486 A | 7/1995 | Wong | |
| 5,638,402 A | 6/1997 | Osaka et al. | |
| 5,990,721 A | 11/1999 | Mellitz | |
| 6,098,176 A | 8/2000 | Coteus et al. | |
| 6,184,736 B1 | 2/2001 | Wissell et al. | |
| 6,229,861 B1 | 5/2001 | Young | |

(Continued)

FOREIGN PATENT DOCUMENTS

| | | |
|---|---|---|
| JP | H05324121 A | 12/1993 |
| JP | H0854957 A | 2/1996 |

(Continued)

OTHER PUBLICATIONS

Australian Examination Report for Application No. 2016283778 dated Feb. 8, 2021.

(Continued)

*Primary Examiner* — Cassandra F Cox
(74) *Attorney, Agent, or Firm* — Tarolli, Sundheim, Covell & Tummino LLP

(57) ABSTRACT

One example includes a clock distribution resonator system. The system includes a clock source configured to generate a clock signal having a predefined wavelength. The system also includes a plurality of transmission line branches each coupled to the clock source to propagate the clock signal. The system also includes a plurality of clock distribution networks coupled to the respective plurality of transmission line branches and being configured to provide the clock signal to each of a plurality of circuits. The system further includes at least one damping resonator. Each of the at least one damping resonator can be coupled to a respective at least one of the transmission line branches and configured to propagate the clock signal. The at least one damping resonator can have at least one resonator characteristic that is different relative to a respective resonator characteristic(s) associated with the transmission line branches and/or the clock distribution networks.

20 Claims, 4 Drawing Sheets

(56) References Cited

U.S. PATENT DOCUMENTS

| | | |
|---|---|---|
| 6,563,357 B1 | 5/2003 | Hsu et al. |
| 6,563,358 B1 | 5/2003 | Goulette |
| 6,978,328 B1 | 12/2005 | Osaka et al. |
| 7,145,408 B2 | 12/2006 | Shepard et al. |
| 7,880,551 B2 | 2/2011 | Chan et al. |
| 8,525,569 B2 | 9/2013 | Bucelot et al. |
| 9,509,490 B1 | 11/2016 | Dabral |
| 9,634,654 B2 | 4/2017 | Bucelot et al. |
| 9,722,589 B1 | 8/2017 | Talanov et al. |
| 9,939,841 B1 | 4/2018 | Dusatko |
| 10,133,299 B1 | 11/2018 | Strong et al. |
| 10,234,892 B2 * | 3/2019 | Dusatko .............. H01F 17/0006 |
| 10,331,163 B1 | 6/2019 | Luo |
| 10,431,867 B1 | 10/2019 | Strong et al. |
| 10,474,183 B2 | 11/2019 | Strong et al. |
| 10,520,974 B2 | 12/2019 | Strong et al. |
| 10,591,952 B1 | 3/2020 | Strong et al. |
| 10,754,371 B1 | 8/2020 | Strong et al. |
| 10,884,450 B2 | 1/2021 | Strong et al. |
| 2005/0057286 A1 | 3/2005 | Shepard et al. |
| 2007/0285179 A1 | 12/2007 | Ikeda et al. |
| 2009/0146748 A1 | 6/2009 | Pernia et al. |
| 2014/0210518 A1 | 7/2014 | Chang et al. |
| 2016/0125309 A1 | 5/2016 | Naaman et al. |
| 2016/0370822 A1 | 12/2016 | Strong et al. |
| 2019/0278321 A1 | 9/2019 | Strong et al. |
| 2021/0080995 A1 | 3/2021 | Strong et al. |

FOREIGN PATENT DOCUMENTS

| | | |
|---|---|---|
| JP | 2005-267289 A | 9/2005 |
| WO | 20160209387 A1 | 12/2016 |

OTHER PUBLICATIONS

International Search Report for Application No. PCT/US2020/053319 dated Mar. 16, 2021.

Sasaki, A High-Frequency Clock Distribution Network Using Inductively Loaded Standing-Wave Oscillators (Year: 2009).

V.L. Chi, "Salphasic Distribution of Clock Signals for Synchronous Systems", IEEE Transactions on Computers, IEEE Service Center, vol. 43, No. 5, May 1, 1994.

Quentin P Herr Et al., "Ultra-Low-Power Superconductor Logic", arxiv.org, Cornell University Library, 201 Olin Library Cornell University Ithaca, NY 14853, Mar. 22, 2011, XP080545411, doi: 10.1063/1.3585849 the whole document.

* cited by examiner

CLOCK DISTRIBUTION RESONATOR SYSTEM

TECHNICAL FIELD

The present invention relates generally to computer systems, and specifically to a clock distribution resonator system.

BACKGROUND

Typical circuits that implement logic functions can operate based on a clock to synchronize data and/or provide a time-based flow of the logic functions. Circuits that are based on complementary metal-oxide-semiconductor (CMOS) technology can implement a clock to indicate when a given logic circuit or gate is to capture data at one or more inputs for processing or transferring the data to other logic functions. A given clock can thus provide a clock signal to a variety of devices in the circuit to provide the requisite timing information, and thus to substantially synchronize data transfer and timing functions. Other types of circuits can implement clock signals, such as reciprocal quantum logic (RQL) circuits. RQL circuits can implement timing information based on a clock that is provided, for example, as a sinusoidal signal having a substantially stable frequency.

SUMMARY

One example includes a clock distribution resonator system. The system includes a clock source configured to generate a clock signal having a predefined wavelength. The system also includes a plurality of transmission line branches each coupled to the clock source to propagate the clock signal. The system also includes a plurality of clock distribution networks coupled to the respective plurality of transmission line branches and being configured to provide the clock signal to each of a plurality of circuits. The system further includes at least one damping resonator. Each of the at least one damping resonator can be coupled to a respective at least one of the transmission line branches and configured to propagate the clock signal. The at least one damping resonator can have at least one resonator characteristic that is different relative to a respective resonator characteristic(s) associated with the transmission line branches and/or the clock distribution networks.

Another embodiment includes a method for fabricating a clock distribution resonator system. The method includes providing a clock source configured to generate a clock signal having a predefined wavelength. The method also includes coupling a plurality of transmission line branches to the clock source. Each of the transmission line branches can have a plurality of resonator characteristics. The method also includes coupling a plurality of clock distribution networks to the respective plurality of transmission line branches, such that the transmission line branches are configured to propagate the clock signal to the clock distribution networks. The method also includes coupling a plurality of circuits to each of the clock distribution networks to provide the clock signal to each of the circuits. The method further includes coupling at least one damping resonator to a respective at least one of the transmission line branches, such that the each of the at least one damping resonator is configured to propagate the clock signal. The at least one damping resonator can have at least one resonator characteristic that is different relative to a respective at least one resonator characteristic associated with at least one of the transmission line branches and the clock distribution networks.

Another embodiment includes a clock distribution resonator system. The system includes a clock source configured to generate a clock signal having a predefined wavelength. The system includes a plurality of transmission line branches each coupled to the clock source to propagate the clock signal. The system also includes a plurality of clock distribution networks coupled to the respective plurality of transmission line branches and being configured to provide the clock signal to each of a plurality of circuits. The system further includes at least one damping resonator. Each of the at least one damping resonator includes at least one transmission line segment coupled to a respective one of the transmission line branches and a resistor interconnecting the at least one transmission line segment and a low-voltage rail. The at least one damping resonator can have at least one resonator characteristic that is different relative to a respective at least one resonator characteristic associated with at least one of the transmission line branches and the clock distribution networks.

DETAILED DESCRIPTION

Figure 1:
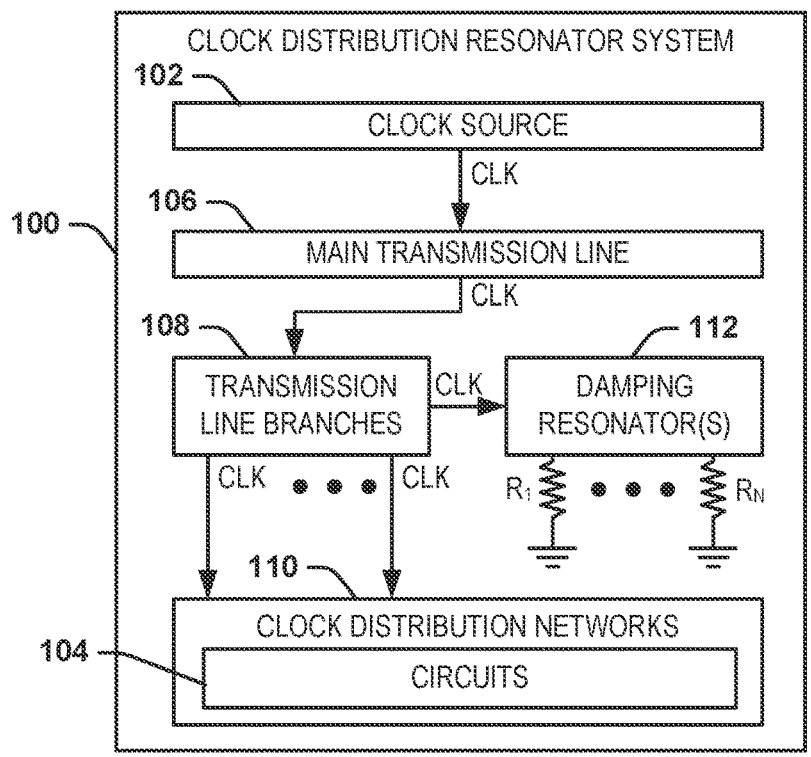
FIG. 1 illustrates an example block diagram of a clock distribution resonator system.

The present invention relates generally to computer systems, and specifically to a clock distribution resonator system. The clock distribution resonator system can be implemented to distribute a clock signal, such as a sinusoidal clock signal, to a plurality of clock distribution networks that are configured to provide the clock signal to one or more respective separate circuits, such as associated with a single integrated circuit (IC) chip, across a plurality of IC chips, or across one or more printed circuit boards (PCBs). For example, the clock distribution networks can be arranged as dynamic zeroth-order resonators ("DynaZORs") that implement a resonator "spine" and "rib" configuration, such as described in U.S. application Ser. No. 15/816,518, which is incorporated herein by reference in its entirety. Therefore, each of the clock distribution networks can be implemented in a superconducting environment, such as to inductively couple the clock signal to the associated circuit(s). Accordingly, the clock distribution resonator system can provide the clock signal to a large number of circuits that are spatially separated, or a very large circuit, to facilitate synchronization of functions of the circuit(s), such as at very high speeds (e.g., ten or more GHz).

As an example, the clock distribution resonator system can include a clock generator to generate the clock signal, and can include a main transmission line that is configured to propagate the clock signal to a plurality of transmission line branches. For example, the main transmission line and the transmission line branches can be arranged as a dendritic network that can provide multiple splits of the clock signal to multiple transmission line branches along multiple layers of the dendritic network. As an example, the main transmission line can have a predetermined length that is associated with the predefined wavelength of the clock signal. For example, the main transmission line can have a length that is an odd multiple of a quarter period of the predefined wavelength λ of the clock signal (e.g., 14). Each of the transmission line branches that branch from the main transmission line can likewise have a predetermined length that is associated with the predefined wavelength of the clock signal, with the length of the transmission line branches being different from the length of the main transmission line.

As an example, each of the transmission line branches can include a plurality of transmission line segments that each have a predefined length, such as a half period of the predefined wavelength of the clock signal (e.g., 12). Therefore, each of the transmission line branches can have a length that is a multiple of the half period of the predefined wavelength of the clock signal. As a result, the transmission line branches can have a resonant frequency that is approximately equal to the frequency of the clock signal. However, due to fabrication tolerance mismatches, one or more of the transmission line branches can have a resonant frequency that varies relative to the frequency of clock signal. As a result, certain undesirable resonant modes of the clock signal can be exhibited on the clock distribution resonator system at frequencies near the frequency of the clock signal. Such resonant modes can result in frequency response differences between the transmission line branches, thereby degrading the performance of the circuits to which the clock signal is provided.

To suppress the undesired modes, the clock distribution resonator system includes at least one damping resonator that is coupled to a respective one of the transmission line branches. Therefore, the damping resonator(s) can likewise propagate the clock signal. The damping resonator(s) can include at least one transmission line segment and a resistor, and can be fabricated to have at least one resonator characteristic that differs from a respective at least one resonator characteristic of each of at least one of the transmission line branches and the clock distribution networks. As described herein, the term "resonator characteristic" defines a characteristic that affects the resonant propagation of the clock signal through the respective damping resonator. As an example, the resonator characteristic can include a physical length relative to the resonant frequency and/or an impedance associated with the damping resonator relative to the transmission line branches. The difference in resonator characteristic(s) relative to the transmission line branches can provide suppression of the undesired frequency modes of the clock signal, such as based on reflection and cancellation of the undesired modes of the clock signal on the respective transmission line branches. Accordingly, the clock distribution resonator system can operate in a more effective manner to provide the clock signal to the circuits by suppressing the undesired frequency modes propagating in the transmission line branches via the damping resonator(s).

FIG. 1 illustrates an example diagram of a clock distribution resonator system 100. The clock distribution resonator system 100 can be implemented in a variety of applications, such as in a reciprocal quantum logic (RQL) circuit design. For example, the clock distribution resonator system 100 can be implemented in or as part of an integrated circuit (IC) chip, a printed circuit board (PCB), or across multiple IC chips and/or PCBs.

The clock distribution resonator system 100 includes a clock source 102. The clock source 102 can be configured to generate a clock signal CLK, such as a sinusoidal clock signal, at a predetermined frequency (e.g., 1-20 GHz). As an example, the clock source 102 can be configured as any of a variety of oscillators configured to provide a stable frequency reference to each of a respective one or more circuits 104 that may be distributed across the IC chip(s) and/or PCB(s) in which the clock distribution resonator system 100 is implemented, as described herein. In the example of FIG. 1, the clock source 102 is coupled to a main transmission line 106 that is configured to propagate the clock signal CLK to a plurality of transmission line branches 108. The transmission line branches 108 can branch off of the main transmission line 106, such as to form a dendritic arrangement of the main transmission line 106 and the transmission line branches 108. As described herein, the dendritic arrangement can include multiple layers, such that each of a first portion of the transmission line branches 108 in a given layer can branch off into separate sets of transmission line branches 108 in a next layer, and so on.

As an example, the main transmission line 106 can have a predetermined length that is associated with the predefined wavelength λ of the clock signal CLK. For example, the main transmission line 106 can have a length that is an odd multiple of a quarter period of the predefined wavelength λ of the clock signal CLK (e.g., λ/4, 3λ/4, 5λ/4, etc.). As a result, the clock signal CLK can be provided at the end of the main transmission line 106 at an anti-node that can provide the greatest amplitude of the clock signal CLK to the transmission line branches 108. As another example, each of the transmission line branches 108 that branch from the main transmission line 106 can likewise have a predetermined length that is associated with the predefined wavelength λ of the clock signal CLK, with the length of the transmission line branches 108 being different from the length of the main transmission line 106. As an example, the transmission line branches 108 can each include a plurality of transmission line segments of a predetermined length, such as a half period of the predefined wavelength λ of the clock signal CLK. Therefore, the transmission line branches 108 can have a length that is a multiple of the half period of the predefined wavelength λ of the clock signal CLK (e.g., λ/2, λ, 3λ/2, 2λ, etc.). For example, each of the transmission line branches 108 in each of the layers of the dendritic arrangement can have the same predefined length. Therefore, each end of each of the transmission line branches 108 can be associated with the anti-node of the clock signal CLK, and can thus provide the maximum amplitude at a distal end relative to the main transmission line 106.

In the example of FIG. 1, the transmission line branches 108 provide the clock signal CLK to each of a plurality of clock distribution networks 110. As described herein, the term "clock distribution network" corresponds to a circuit or physical resonator arrangement that is configured to provide the clock signal CLK to one or more of the circuit(s) 104. As an example, the clock distribution networks 110 can each correspond to dynamic zeroth-order resonators ("DynaZORs") that implement a resonator "spine" and "rib" configuration. Therefore, each of the clock distribution networks 110 can be implemented in a superconducting environment, such as to inductively couple the clock signal CLK to the associated circuit(s) 104. The clock distribution networks 110 can be associated with each of the transmission line branches 108 in a lowest level of a dendritic arrangement, for example.

As described above, the transmission line branches 108 and the clock distribution networks 110 can be fabricated to have a resonant frequency that is approximately equal to the frequency of the clock signal CLK. However, due to fabrication tolerance mismatches, one or more of the transmission line branches 108 can have a resonant frequency that deviates from the frequency of the clock signal CLK. As a result, certain undesirable resonant modes of the clock signal CLK can be exhibited on the clock distribution resonator system 100 at frequencies near the frequency of the clock signal CLK. Such resonant modes can result in frequency response differences between the transmission line branches 108, thereby degrading the performance of the circuits 104 to which the clock signal CLK is provided. For example, the degradation could affect the uniformity of the amplitude of the clock signal CLK or the phase of the clock signal CLK across the transmission line branches 108.

To suppress the undesired frequency modes, in the example of FIG. 1, the clock distribution resonator system 100 includes at least one damping resonator 112 that is coupled to a respective one of the transmission line branches 108, such that the clock signal CLK propagates through each of the damping resonator(s) 112. Each of the damping resonator(s) 112 includes a terminated resistor, demonstrated in the example of FIG. 1 as resistors $R_1$ through $R_N$, coupled to a low-voltage rail (e.g., ground), where N is a positive integer. Each of the damping resonator(s) 112 can be fabricated to have a resonator characteristic that differs from the transmission line branches 108. For example, the damping resonator(s) 112 can have a physical length that results in a resonant frequency that is detuned from the frequency of the clock signal CLK. As another example, the damping resonator(s) 112 can have an impedance that differs from the transmission line branches 108. The difference in the resonant characteristic(s) of the damping resonator(s) 112 relative to the transmission line branches 108 can operate to suppress the undesired frequency modes of the clock signal CLK, as described in greater detail herein.

Figure 2:
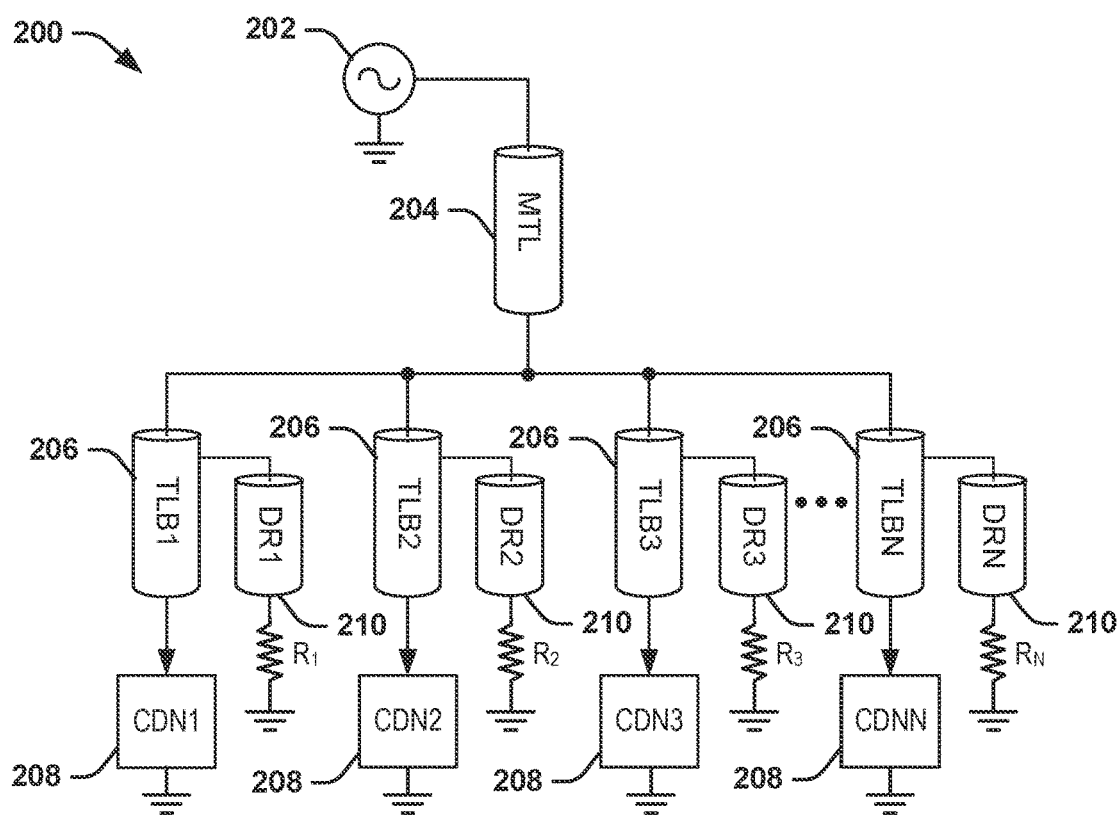
FIG. 2 illustrates an example of a clock distribution resonator system.

FIG. 2 illustrates an example of a clock distribution resonator system 200. The clock distribution resonator system 200 can correspond to the clock distribution resonator system 100 in the example of FIG. 1. Therefore, reference is to be made to the example of FIG. 1 in the following description of the example of FIG. 2. Similar to as described previously, the clock distribution resonator system 200 can be implemented in a variety of applications to provide the clock signal CLK to a variety of different circuits that can be distributed across an IC chip, a PCB, or across multiple IC chips and/or PCBs.

The clock distribution resonator system 200 includes a clock source 202 configured to generate the clock signal CLK, such as a sinusoidal clock signal, at a predetermined frequency (e.g., ten or more GHz). The clock source 202 is coupled to a main transmission line 204 that is configured to propagate the clock signal CLK to a plurality N of transmission line branches 206, demonstrated as "TLB1" to "TLBN", where N is a positive integer greater than one. In the example of FIG. 2, the main transmission line 204 and the transmission line branches 206 are configured in a dendritic arrangement, such that the transmission line branches 206 branch off of the main transmission line 204 to provide the clock signal CLK to each of a respective plurality N of clock distribution networks 208, demonstrated as "CDN1" to "CDNN". Therefore, the clock distribution networks 208 are configured to provide the clock signal CLK to each of one or more associated circuits (not shown in the example of FIG. 2) to provide timing and other functions to the respective circuit(s).

As an example, the main transmission line 204 can have a predetermined length that is associated with the predefined wavelength $\lambda$ of the clock signal CLK. For example, the main transmission line 204 can have a length that is an odd multiple of a quarter period of the predefined wavelength $\lambda$ of the clock signal CLK (e.g., $\lambda/4$, $3\lambda/4$, $5\lambda/4$, etc.). As a result, the clock signal CLK can be provided at the end of the main transmission line 204 at an anti-node that can provide the greatest amplitude of the clock signal CLK to the transmission line branches 206. Additionally, because the main transmission line 204 can have a length that is an odd multiple of a quarter period of the predefined wavelength $\lambda$ of the clock signal CLK, the main transmission line 204 provides a significantly high impedance from the clock distribution networks 208 to the clock source 202.

As another example, each of the transmission line branches 206 that branch from the main transmission line 204 can each include a plurality of transmission line segments of a predetermined length, such as a half period of the predefined wavelength $\lambda$ of the clock signal CLK. Therefore, the transmission line branches 206 can have a length that is a multiple of the half period of the predefined wavelength $\lambda$ of the clock signal CLK (e.g., $\lambda/2$, $\lambda$, $3\lambda/2$, $2\lambda$, etc.). For example, each of the transmission line branches 206 in each of the layers of the dendritic arrangement can have the same predefined length. Therefore, each end of each of the transmission line branches 206 can be associated with the anti-node of the clock signal CLK, and can thus provide the maximum amplitude at a distal end relative to the main transmission line 204.

Similar to as described above in the example of FIG. 1, to suppress undesired frequency modes of the clock signal CLK at frequencies near the frequency of the clock signal CLK, the clock distribution resonator system 200 includes a plurality N of damping resonators 210, demonstrated in the example of FIG. 2 as "DR1" to "DRN". Each of the damping resonators 210 is coupled to a respective one of the transmission line branches 206, such that the clock signal CLK propagates through each of the damping resonators 210. Each of the damping resonators 210 includes at least one transmission line segment (not shown) and a terminated resistor, demonstrated as resistors $R_1$ through $R_N$. As described herein, each of the damping resonators 210 can be fabricated to have a resonator characteristic that differs from at least one of the transmission line branches 206 and the clock distribution networks 208. For example, the damping resonators 210 can have a physical length that results in a resonant frequency that is detuned from the frequency of the clock signal CLK. As another example, the damping resonators 210 can have an impedance that differs from the transmission line branches 206 and/or the clock distribution networks 208, such as based on the value of the respective resistor $R_1$ through $R_N$. The difference in the resonant characteristic(s) of the damping resonators 210 relative to the transmission line branches 206 and/or the clock distribution networks 208 can operate to suppress the undesired frequency modes of the clock signal CLK.

For example, the damping resonators 210 can be designed to be detuned with respect to the resonator characteristic(s) relative to the transmission line branches 206 in a variety of ways. As an example, the clock distribution resonator system 200 can be simulated in software, such as via a software circuit design and/or simulation tool. Thus, the frequency characteristics of the clock distribution resonator system 200 can be determined in the simulation. Accordingly, the damping resonators 210 can likewise be simulated to determine the frequency response of the clock distribution resonator system 200 to achieve an optimal design for the damping resonators 210 for suppressing the undesired frequency modes of the clock signal CLK.

Figure 3:
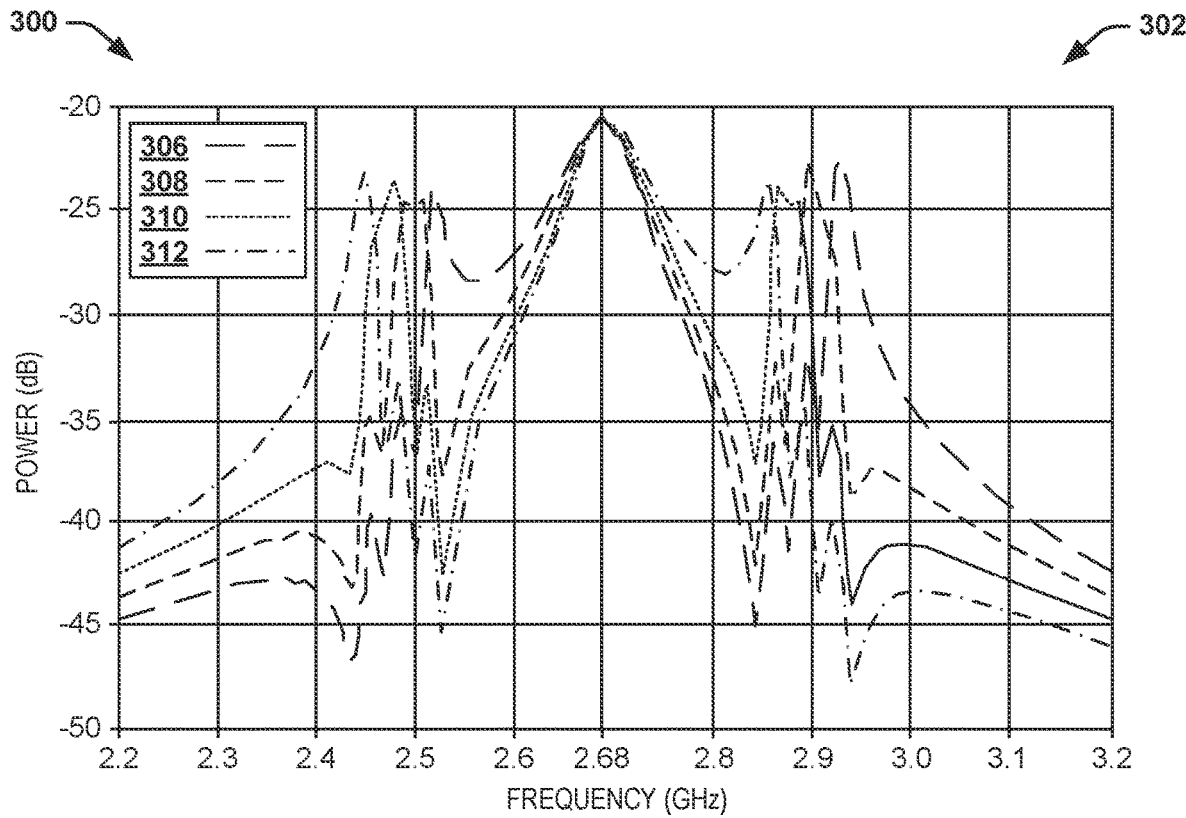
FIG. 3 illustrates an example of graphs of frequency response in a clock distribution resonator system.
Figure 3:
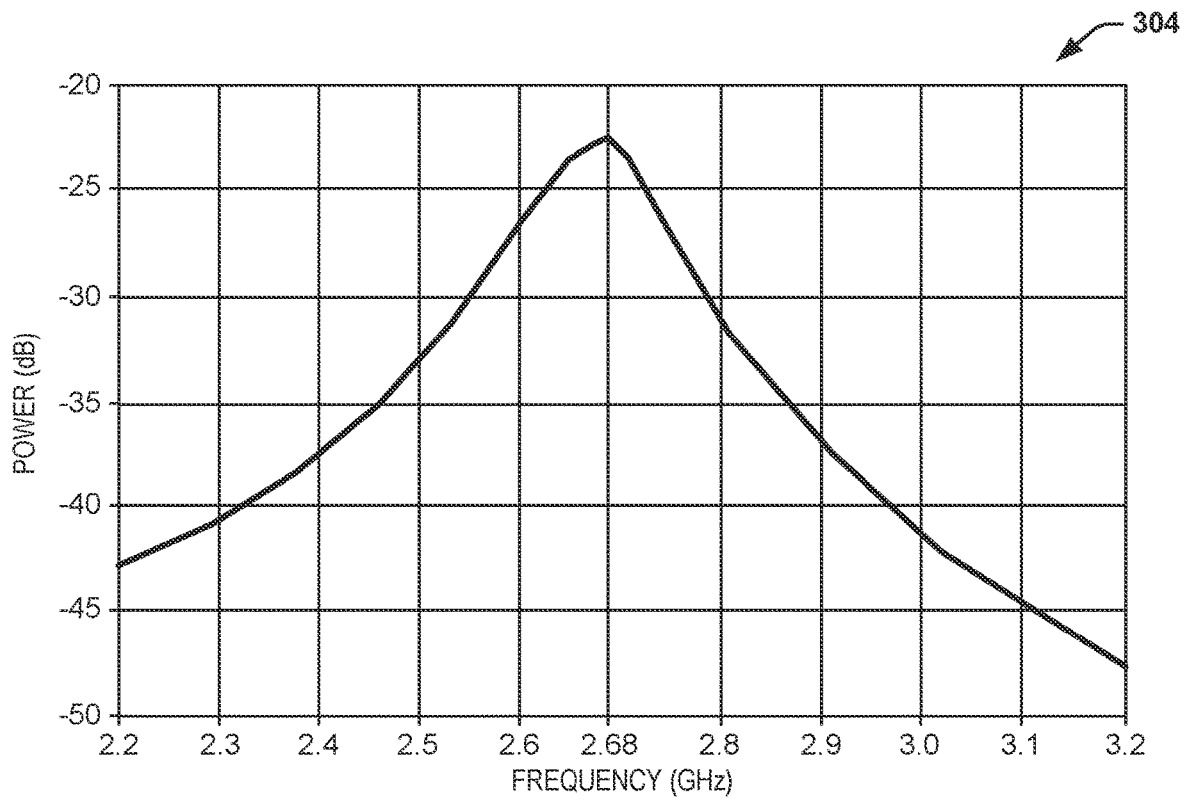

FIG. 3 illustrates an example diagram 300 of graphs of frequency response in a clock distribution resonator system. The diagram 300 demonstrates a first graph 302 and a second graph 304. The first graph 302 can correspond to a typical clock distribution resonator system, while the second graph 304 can correspond to the clock distribution resonator system 200 in the example of FIG. 2. The typical clock distribution resonator system represented by the graph 302 can be fabricated approximately the same as the clock distribution resonator system 200, but without the inclusion of the damping resonators 210, as described herein. Therefore, reference is to be made to the example of FIG. 2 in the following description of the example of FIG. 3.

The first graph 302 demonstrates a power spectral density (PSD) in decibels of a typical clock distribution resonator system (e.g., measured at a given one of the clock distribution networks of the typical clock distribution resonator system) across a frequency range of approximately 2.2 GHz to approximately 3.2 GHz. The first graph 302 demonstrates four separate plots of the clock signal CLK with respect to transmission line branches and/or clock distribution networks of the typical clock distribution resonator system having slight variations in resonant frequency (e.g., plus or minus), provided in a key as a first plot 306, a second plot 308, a third plot 310, and a fourth plot 312. As described previously, the transmission line branches 206 and the clock distribution networks 208 can be fabricated to have a resonant frequency that is approximately equal to the frequency of the clock signal CLK. However, due to fabrication tolerance mismatches, one or more of the transmission line branches 206 and/or clock distribution networks 208 can have a resonant frequency that deviates from the frequency of the clock signal CLK. As a result, certain undesirable resonant modes of the clock signal CLK can be exhibited on the typical clock distribution resonator system at frequencies near the frequency of the clock signal CLK.

In the example of FIG. 3, the frequency of the clock signal CLK is approximately 2.68 GHz. Therefore, the nominal resonant frequency to which the transmission line branches and clock distribution networks of the typical clock distribution resonator system are fabricated is approximately 2.68 GHz. In the example of FIG. 3, each of the plots 306, 308, 310, and 312 of the clock signal CLK have a highest power at the frequency of the clock signal CLK, at approximately 2.68 GHz, and thus the nominal resonant frequency of each of the transmission line branches and clock distribution networks of the typical clock distribution resonator system. However, based on the fabrication tolerance variations of the transmission line branches and/or clock distribution networks of the typical clock distribution resonator system corresponding to each of the plots 306, 308, 310, and 312 of the clock signal CLK, each of the plots 306, 308, 310, and 312 of the clock signal CLK exhibit undesired frequency modes at frequencies near the resonant frequency of the typical clock distribution resonator system (e.g., approximately 2.68 GHz). Therefore, each of the plots 306, 308, 310, and 312 of the clock signal CLK are demonstrated in the first graph 302 as including spurious power distributions at frequency ranges above and below the resonant frequency of the typical clock distribution resonator system. In the example of FIG. 3, the undesired frequency modes are exhibited at frequencies of between approximately 2.43 GHz and approximately 2.53 GHz, and between approximately 2.84 GHz and approximately 2.94 GHz.

As described above, the second graph 304 can therefore correspond to the clock distribution resonator system 200, in which the damping resonators 210 are coupled to the transmission line branches 206. Therefore, the damping resonators 210 can provide suppression of the undesired frequency modes of the clock signal CLK at frequencies near the resonant frequency of the clock distribution resonator system 200 (e.g., approximately 2.68 GHz). In the second graph 304, the undesired frequency modes at frequencies between approximately 2.43 GHz and approximately 2.53 GHz, and between approximately 2.84 GHz and approximately 2.94 GHz are suppressed. Instead, the plot of the clock signal CLK in the second graph 304 is demonstrated as a single plot to represent an approximate uniformity of the clock signal CLK associated with each of the respective transmission line branches 206. For example, the clock signal CLK can propagate through each of the transmission line branches 206 and clock distribution networks 208 such that the amplitude variation for the clock signal CLK through each of the transmission line branches 206 and clock distribution networks 208 can vary by a small amplitude (e.g., 4% or less). Accordingly, the example of FIG. 3 demonstrates the effect that the damping resonators 210 have on the suppression of the undesired modes of the clock signal CLK resulting from fabrication tolerance variation in the transmission line branches 206 and/or the clock distribution networks 208.

Figure 4:
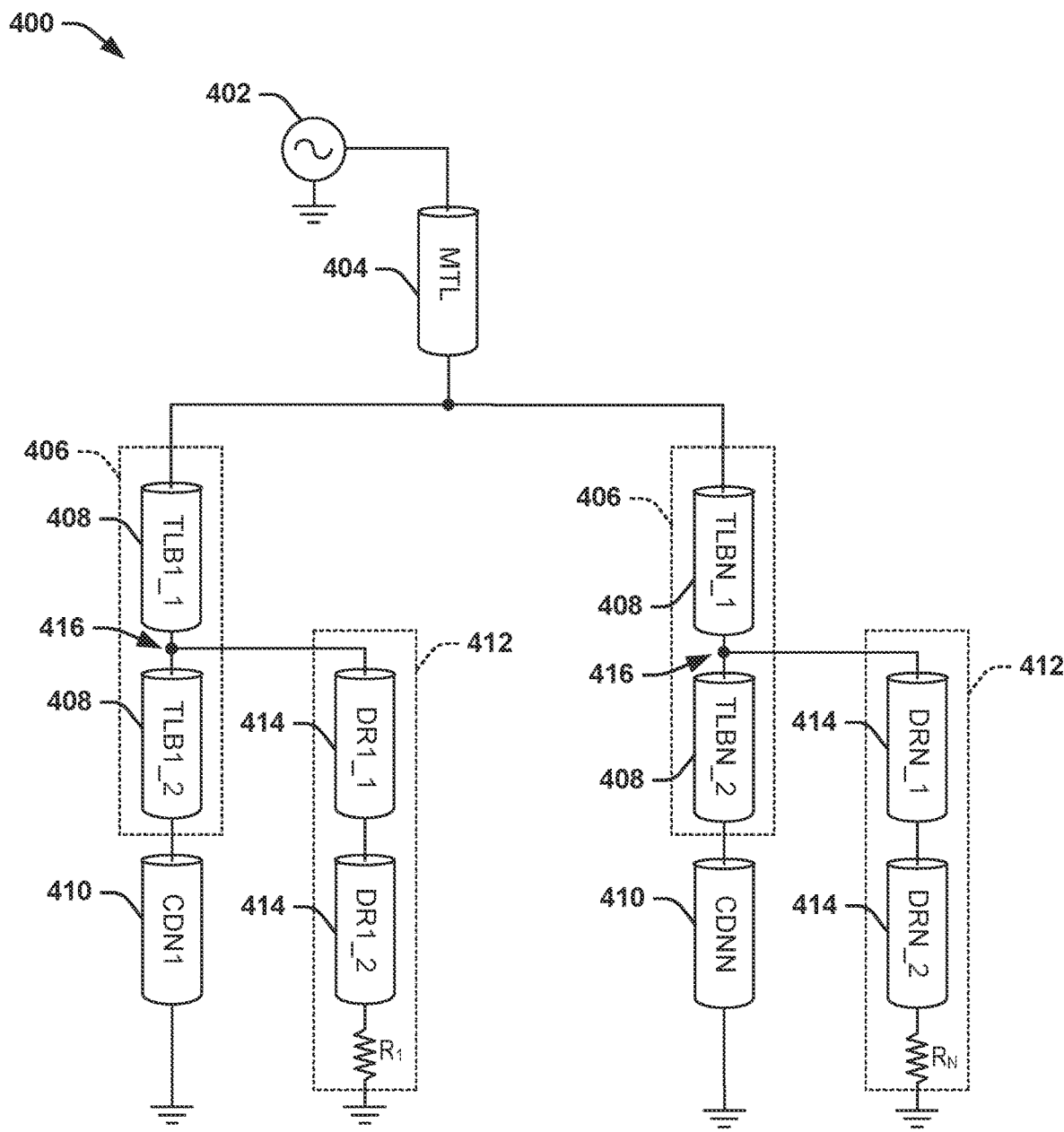
FIG. 4 illustrates another example of a clock distribution resonator system.

FIG. 4 illustrates an example of a clock distribution resonator system 400. The clock distribution resonator system 400 can correspond to the clock distribution resonator system 100 in the example of FIG. 1. Therefore, reference is to be made to the example of FIG. 1 in the following description of the example of FIG. 4. Similar to as described previously, the clock distribution resonator system 400 can be implemented in a variety of applications to provide the clock signal CLK to a variety of different circuits that can be distributed across an IC chip, a PCB, or across multiple IC chips and/or PCBs.

The clock distribution resonator system 400 includes a clock source 402 configured to generate the clock signal CLK, such as a sinusoidal clock signal, at a predetermined frequency (e.g., ten or more GHz). The clock source 402 is coupled to a main transmission line 404 that is configured to propagate the clock signal CLK to a plurality N of transmission line branches 406. Each of the transmission line branches 406 includes a plurality of transmission line segments 408. In the example of FIG. 4, each of the transmission line branches 406 includes a pair of transmission line segments 408, demonstrated as "TLBX_1" and "TLX_2", where X is an index corresponding to the respective transmission line branch 406 (e.g., X=1 through N). As an example, each of the transmission line segments 408 can have a physical length of approximately half a period of the predefined wavelength $\lambda$ of the clock signal CLK (e.g., $\lambda/2$). In the example of FIG. 4, each of the transmission line branches 406 provide the clock signal CLK to each of a respective plurality N of clock distribution networks 410, demonstrated as "CDN1" to "CDNN". Therefore, the clock distribution networks 410 are configured to provide the clock signal CLK to each of one or more associated circuits (not shown in the example of FIG. 4) to provide timing and other functions to the respective circuit(s).

Similar to as described above in the example of FIGS. 1 and 2, to suppress undesired frequency modes of the clock signal CLK at frequencies near the frequency of the clock signal CLK, the clock distribution resonator system 400 includes a plurality N of damping resonators 412. In the example of FIG. 4, each of the damping resonators 412 includes a plurality of transmission line segments 414, demonstrated as "DRX_1" and "DRX_2", where X is the index corresponding to the respective damping resonator 412, as well as a terminated resistor, demonstrated as $R_1$ through $R_N$. Each of the damping resonators 412 is coupled to a node 416 between the pair of transmission line segments 408 of a respective one of the transmission line branches 406. Therefore, the clock signal CLK propagates through the first transmission line segment 408 (e.g., TLBX_1) of each of the transmission line branches 406, and is split to propagate through the rest of the respective transmission line branch 406 to the respective clock distribution network 410 as well as the respective damping resonator 412.

As described herein, each of the damping resonators 412 can be fabricated to have a resonator characteristic that differs from the transmission line branches 406 and/or the clock distribution networks 410. For example, for the damping resonators 412 to have resonator characteristics the same as the respective transmission line branches 406, the second transmission line segment 408 (e.g., TLBX_2) of the transmission line branches 406 can have a physical length (e.g., 12) and an impedance that is approximately the same as a physical length and an impedance of the first transmission line segment 414 (e.g., DRX_1) of the respective damping resonator 412. Similarly, the clock distribution network 410 can have an effective physical length (e.g., the spine, such as 12) and an impedance that is approximately the same as a physical length and an impedance of the second transmission line segment 414 (e.g., DRX_2) of the respective damping resonator 412. However, the damping resonators 412 can be fabricated to have at least one intentionally different resonator characteristic than the corresponding transmission line branch 406 and/or corresponding clock distribution network 410.

As an example, the impedance of the damping resonators 412 can be different from the impedance of the transmission line branch 406 and/or clock distribution network 410. For example, the impedance of the first transmission line segment 414 (e.g., DRX_1) of the respective damping resonator 412 can be different from the second transmission line segment 408 (e.g., TLBX_2) of the transmission line branches 406. Similarly, the impedance of the second transmission line segment 414 (e.g., DRX_2) of the respective damping resonator 412 can be different from the impedance of the clock distribution network 410. As another example, the resistor RX can be tuned to have a resistance that varies the impedance of the damping resonator 412 relative to the combination of the transmission line branches 406 and the clock distribution networks 410. As yet example, the physical length of the damping resonators 412 can be different from the physical length of the transmission line branch 406 and/or clock distribution network 410. For example, the length of the first transmission line segment 414 (e.g., DRX_1) of the respective damping resonator 412 can be different from (e.g., shorter than or longer than) the second transmission line segment 408 (e.g., TLBX_2) of the transmission line branches 406. Similarly, the physical length of the second transmission line segment 414 (e.g., DRX_2) of the respective damping resonator 412 can be different from the physical length (e.g., of the spine) of the clock distribution network 410.

The arrangement of the damping resonators 412 and the transmission line branches 406 is demonstrated in the example of FIG. 4 by example. Therefore, other physical arrangements of the damping resonators 412 and the transmission line branches 406 is possible. For example, the coupling of the damping resonators 412 to the respective transmission line branches 406 can be at different nodes, with corresponding changes to the number of transmission line segments 414 in the damping resonator 412 to provide approximate (and slightly detuned) matching to the transmission line branch 406 and/or clock distribution network 410. As an example, the damping resonator 412 can be coupled to the main transmission line 404 and can include an additional transmission line segment that is matched (or slightly detuned) to the first transmission line segment 408 (e.g., TLBX_1) of the transmission line branch 406. As another example, the damping resonator 412 can be coupled between the second transmission line segment 408 (e.g., TLBX_2) and the clock distribution network 410, and can include one fewer transmission line segment that is matched (or slightly detuned) to the clock distribution network 410. Accordingly, the clock distribution resonator system 400 can be arranged in any of a variety of ways to include damping resonators 412 to suppress undesired frequency modes in the propagation of the clock signal CLK.

Based on the variance of the resonator characteristic(s) of the damping resonators 412 relative to the transmission line branches 406 and/or clock distribution networks 410, the clock distribution resonator system 400 can provide for suppression of the undesired frequency modes of the clock signal CLK. For example, the clock signal CLK can reflect from the termination of the damping resonator 412. The reflected clock signal CLK can thus combine with the undesired frequency mode of the clock signal CLK at the node 416, thus substantially cancelling the undesired frequency mode at the node 416. Accordingly, by mitigating the undesired frequency modes of the clock signal CLK from propagating in the clock distribution resonator system 400, the clock distribution resonator system 400 can operate in a more effective manner to provide the clock signal CLK to the circuits coupled to the clock distribution networks 410.

Figure 5:
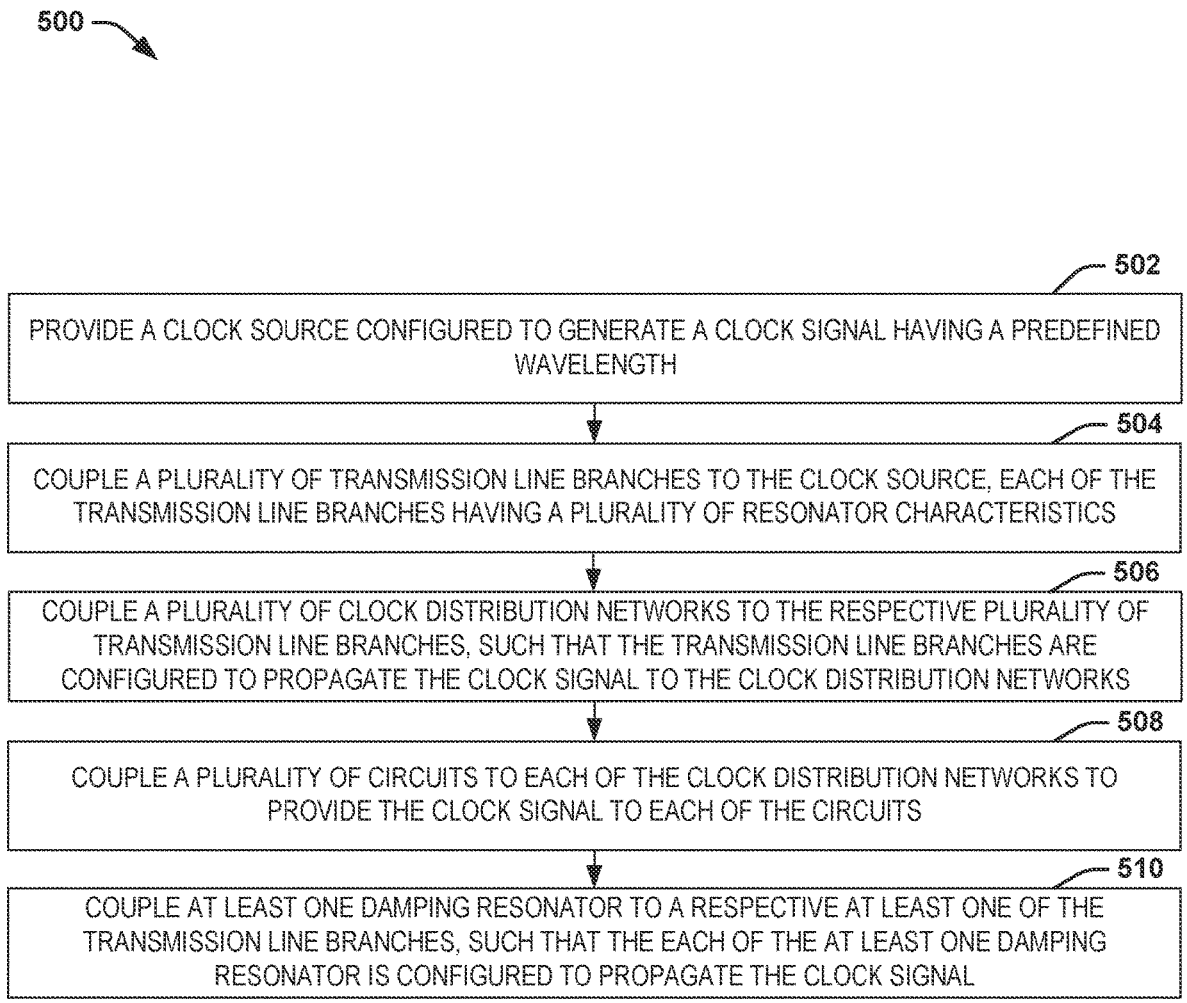
FIG. 5 illustrates a method for fabricating a clock distribution resonator system.

In view of the foregoing structural and functional features described above, methods in accordance with various aspects of the present disclosure will be better appreciated with reference to FIG. 5. While, for purposes of simplicity of explanation, the method of FIG. 5 is shown and described as executing serially, it is to be understood and appreciated that the present disclosure is not limited by the illustrated orders, as some aspects could, in accordance with the present disclosure, occur in different orders and/or concurrently with other aspects from that shown and described herein. Moreover, not all illustrated features may be required to implement method in accordance with an aspect of the present disclosure.

FIG. 5 illustrates a method 500 for fabricating a clock distribution resonator system (e.g., the clock distribution resonator system 100). At 502, a clock source (e.g., the clock source 102) configured to generate a clock signal (e.g., the clock signal CLK) having a predefined wavelength is provided. At 504, a plurality of transmission line branches (e.g., the transmission line branches 108) are coupled to the clock source. Each of the transmission line branches can have a plurality of resonator characteristics. At 506, a plurality of clock distribution networks (e.g., the clock distribution networks 110) are coupled to the respective plurality of transmission line branches, such that the transmission line branches are configured to propagate the clock signal to the clock distribution networks. At 508, a plurality of circuits (e.g., the circuits 104) are coupled to each of the clock distribution networks to provide the clock signal to each of the circuits. At 510, at least one damping resonator (e.g., the damping resonator(s) 112) is coupled to a respective at least one of the transmission line branches, such that the each of the at least one damping resonator is configured to propagate the clock signal. The at least one damping resonator can have at least one resonator characteristic that is different relative to a respective at least one resonator characteristic associated with at least one of the transmission line branches and the clock distribution networks.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A clock distribution resonator system comprising:
 a clock source configured to generate a clock signal having a predefined wavelength;
 a plurality of transmission line branches each coupled to the clock source to propagate the clock signal;
 a plurality of clock distribution networks coupled to the respective plurality of transmission line branches and being configured to provide the clock signal to each of a plurality of circuits;
 at least one damping resonator, each of the at least one damping resonator being coupled to a respective at least one of the transmission line branches and configured to propagate the clock signal, the at least one damping resonator having at least one resonator characteristic that is different relative to a respective at least one resonator characteristic associated with at least one of the transmission line branches and the clock distribution networks.

2. The system of claim 1, wherein each of the at least one damping resonator comprises:
 at least one transmission line segment coupled to a respective one of the transmission line branches; and
 a resistor interconnecting the at least one transmission line segment and a low-voltage rail.

3. The system of claim 2, wherein the at least one resonator characteristic comprises an impedance associated with each of the at least one transmission line segment.

4. The system of claim 2, wherein the at least one resonator characteristic comprises a physical length associated with each of the at least one transmission line segment.

5. The system of claim 2, wherein the at least one resonator characteristic comprises a resistance value associated with the resistor.

6. The system of claim 1, wherein the at least one resonator characteristic comprises at least one of an impedance and a physical resonator length associated with the respective at least one damping resonator.

7. The system of claim 1, wherein the at least one damping resonator comprises a plurality of damping resonators, each of the damping resonators being coupled to a respective one of the plurality of transmission line branches.

8. The system of claim 1, wherein the at least one resonator characteristic of each of the at least one damping resonator differs from a respective at least one aggregate resonator characteristic of the respective one of the transmission line branches and a respective one of the clock distribution networks.

9. The system of claim 1, wherein each of the transmission line branches comprises a plurality of transmission line segments, wherein each of the at least one damping resonator is conductively coupled to a node between two of the transmission line segments of a respective one of the transmission line branches.

10. The system of claim 1, further comprising a main transmission line coupled to the clock source and configured to propagate the clock signal to the transmission line branches.

11. A dynamic zeroth-order resonator (DynaZOR) comprising the clock distribution resonator system of claim 1, wherein each of the clock distribution networks is configured to couple the clock signal to each of the plurality of circuits.

12. A method for fabricating a clock distribution resonator system, the method comprising:
 providing a clock source configured to generate a clock signal having a predefined wavelength;
 coupling a plurality of transmission line branches to the clock source, each of the transmission line branches having a plurality of resonator characteristics;
 coupling a plurality of clock distribution networks to the respective plurality of transmission line branches, such that the transmission line branches are configured to propagate the clock signal to the clock distribution networks;
 coupling a plurality of circuits to each of the clock distribution networks to provide the clock signal to each of the circuits; and
 coupling at least one damping resonator to a respective at least one of the transmission line branches, such that the each of the at least one damping resonator is configured to propagate the clock signal, the at least one damping resonator having at least one resonator characteristic that is different relative to a respective at least one resonator characteristic associated with at least one of the transmission line branches and the clock distribution networks.

13. The method of claim 12, wherein each of the at least one damping resonator comprises:
 at least one transmission line segment coupled to a respective one of the transmission line branches; and
 a resistor interconnecting the at least one transmission line segment and a low-voltage rail.

14. The method of claim 13, wherein the at least one resonator characteristic comprises an impedance associated with each of the at least one transmission line segment.

15. The method of claim 13, wherein the at least one resonator characteristic comprises a physical length associated with each of the at least one transmission line segment.

16. The method of claim 13, wherein the at least one resonator characteristic comprises a resistance value associated with the resistor.

17. The method of claim 12, further comprising:
 designing a simulated clock distribution resonator system via a software circuit simulation tool;
 determining frequency characteristics of the simulated clock distribution resonator system;
 adding at least one simulated damping resonator to the simulated clock distribution resonator system;

determining updated frequency characteristics of the simulated clock distribution resonator system to determine the at least one resonator characteristic that is different relative to the respective at least one resonator characteristic associated with at least one of the transmission line branches and the clock distribution networks.

18. A clock distribution resonator system comprising:
a clock source configured to generate a clock signal having a predefined wavelength;
a plurality of transmission line branches each coupled to the clock source to propagate the clock signal;
a plurality of clock distribution networks coupled to the respective plurality of transmission line branches and being configured to provide the clock signal to each of a plurality of circuits;
at least one damping resonator, each of the at least one damping resonator comprising at least one transmission line segment coupled to a respective one of the transmission line branches and a resistor interconnecting the at least one transmission line segment and a low-voltage rail, the at least one damping resonator having at least one resonator characteristic that is different relative to a respective at least one resonator characteristic associated with at least one of the transmission line branches and the clock distribution networks.

19. The system of claim 18, wherein the at least one resonator characteristic comprises at least one of an impedance and a physical length associated with each of the at least one transmission line segment.

20. The system of claim 18, wherein the at least one resonator characteristic comprises a resistance value associated with the resistor.

* * * * *